United States Patent
Uesawa

(10) Patent No.: US 6,953,746 B2
(45) Date of Patent: Oct. 11, 2005

(54) METHOD OF MANUFACTURING A SEMICONDUCTOR APPARATUS WITH A TAPERED APERTURE PATTERN TO FORM A PREDETERMINED LINE WIDTH

(75) Inventor: Fumikatsu Uesawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/720,851

(22) Filed: Nov. 24, 2003

(65) Prior Publication Data

US 2004/0063323 A1 Apr. 1, 2004

Related U.S. Application Data

(63) Continuation of application No. 10/154,237, filed on May 23, 2002, now Pat. No. 6,716,747.

(30) Foreign Application Priority Data

May 23, 2001  (JP) ........................................ 2001-153326

(51) Int. Cl.[7] ............................................. H01L 21/475
(52) U.S. Cl. ...................... 438/640; 438/673; 438/780; 438/978
(58) Field of Search ................................ 438/620, 637, 438/640, 669, 671, 673, 780, 978

(56) References Cited

U.S. PATENT DOCUMENTS

| | | |
|---|---|---|
| 4,409,319 A | 10/1983 | Colacino et al. |
| 4,702,792 A | 10/1987 | Chow et al. |
| 4,816,115 A | 3/1989 | Horner et al. |
| 5,034,091 A | 7/1991 | Trask et al. |
| 5,750,441 A * | 5/1998 | Figura et al. ................ 438/751 |
| 5,913,148 A * | 6/1999 | Hills ........................... 438/701 |
| 5,981,913 A | 11/1999 | Kadomura et al. |
| RE36,663 E | 4/2000 | Smith et al. |
| 6,171,951 B1 | 1/2001 | Lee et al. |
| 6,387,798 B1 * | 5/2002 | Loke et al. .................. 438/623 |
| 6,399,286 B1 | 6/2002 | Liu et al. |
| 6,514,868 B1 * | 2/2003 | Hui et al. .................... 438/713 |
| 6,548,347 B2 * | 4/2003 | Juengling .................... 438/253 |
| 6,649,517 B2 * | 11/2003 | Teh et al. .................... 438/640 |

* cited by examiner

Primary Examiner—Stephen W. Smoot
(74) Attorney, Agent, or Firm—Sonnenschein, Nath & Rosenthal LLP

(57) ABSTRACT

When a hole pattern is formed on a film to be processed, a matching deviation margin at a lithography step is reserved by making a diameter of a bottom of a hole substantially equal to a diameter of an aperture of the hole. The method for manufacturing the semiconductor apparatus includes the steps of: forming a (first) mask material film on a film to be processed; forming a tapered open pattern on the (first) mask material film; and etching the film to be processed by using the (first) mask material film as a mask.

22 Claims, 2 Drawing Sheets

PRIOR ART

METHOD OF MANUFACTURING A SEMICONDUCTOR APPARATUS WITH A TAPERED APERTURE PATTERN TO FORM A PREDETERMINED LINE WIDTH

CROSS REFERENCES TO RELATED APPLICATIONS

The present application is a continuation of U.S. application Ser. No. 10/154,237, filed on May 23, 2002, now U.S. Pat. No. 6,716,747, which claims priority from Japanese Application No. 2001-153326, filed on May 23, 2001, both of which are hereby incorporated by reference.

BACKGROUND OF THE INVENTION

1. Field of the Invention

The present invention relates to a manufacturing method for a semiconductor apparatus, and in detail, the present invention particularly relates to such a manufacturing method for a semiconductor apparatus, wherein a micro wiring pattern is formed.

2. Description of the Related Art

In recent years, the miniaturization of a wiring pattern has been quickly advanced in order to improve the degree of integration and the property of an LSI. The techniques for miniaturizing a gate length in order to improve the property of a transistor and for opening a contact hole smaller than that of a conventional contact hole in order to improve the degree of integration have been strongly requested. It is well known that a limit resolution (R) in an optical lithography process to determine the minimum size of the LSI is represented by the following equation (1):

$$R = k \times \lambda / NA \quad (1)$$

In this case, $\lambda$ is a wave-length of a light source, NA is the numerical aperture in a projection lens, and k is a constant having a value of about 0.5.

That is, in order to attain the lithography process having a resolution higher than that of the conventional one, it is desirable to select a light source having a shorter wave length. Because of this reason, a photolithography machine, which uses a krypton fluorine (KrF) excimer laser having a wave-length of 248 nm as a light source, is used in a field of manufacturing an high technology device. However, NA of a current exposing apparatus is 0.68 at its maximum. Thus, even the latest KrF excimer laser photolithography machine has only a resolution of about 0.18 μm. However, the resolution derived from the equation (1) is applied to a banded pattern typically referred to as a line and space. Then, the resolution of the contact hole pattern has a limit of about 0.22 μm.

On the other hand, a technique for opening a micro contact hole having a diameter of 0.15 μm is requested in a device of 0.13 μm generation. This is the size that can not be easily attained even by using an argon fluorine (ArF) excimer laser photolithography machine, which is expected as a next generation photolithography machine using a light source having a wave length of 193 nm.

As one method of solving this problem, a technique for carrying out an etching process so as to give a taper to a side wall of a hole 112 formed on a film 111 to be processed by using a resist mask 121 is known and thereby finishing it to a desired hole diameter at a bottom 112b of the hole 112, as shown in FIG. 3.

However, as shown in FIG. 4, in the above-mentioned conventional method, even if a desired hole diameter (a hole diameter on design) Db is obtained at the bottom 112b of the hole 112, a diameter Dt at an upper end (aperture) 112t of the hole 112 becomes greater than the desired size (a size on the design). This results in a problem that a sufficient matching margin can not be obtained at a later lithography process. For example, this has a problem that a distance d from a wiring 13I placed adjacently to the hole 112 is made narrower.

The present invention is a manufacturing method for a semiconductor apparatus proposed in order to solve the above-mentioned problems.

SUMMARY OF THE INVENTION

The manufacturing method of a semiconductor apparatus of the present invention includes the steps of: forming a mask material film made of organic insulation film on a film to be processed; forming a tapered opening pattern or aperture pattern, in which a bottom is narrower than an open side on the mask material film; and etching the film to be processed using the mask material film as a mask.

In accordance with the manufacturing method of the semiconductor apparatus, after the mask material film is formed on the film to be processed, the tapered aperture pattern that is narrower at the bottom side than at the aperture side is formed on the film to be processed, and thereby it is possible to able to form the bottom of the aperture pattern at the desired micro dimension exceeding the limit of the lithography technology. The film to be processed is then etched by applying thus-processed mask material film as a mask, thereby, the film to be processed can be vertically etched to the micro dimension exceeding the limit of the lithography technology.

As mentioned above, according to the manufacturing method of the semiconductor apparatus of the present invention, after the mask material film is formed on the film to be processed, the tapered aperture pattern in which the bottom is narrower than the aperture side is formed on this mask material film. Thus, the bottom of the aperture pattern can be formed at the desirable micro dimension exceeding the limit of the lithography technique. The thus-processed mask material film is used as the mask, and the film to be processed is etched. Hence, the film to be processed can be vertically etched to the micro dimension exceeding the limit of the lithography technique. Therefore, since the film to be processed can be processed under the excellently controlling performance with regard to the size, the matching margin is never decreased differently from the conventional direct taper etching method.

DETAILED DESCRIPTION OF THE PREFERRED EMBODIMENT

One embodiment of a manufacturing method for a semiconductor apparatus according to the present invention will be described below with reference to a sectional view of manufacturing steps of FIGS. 1A to 1E.

Figure 1A:
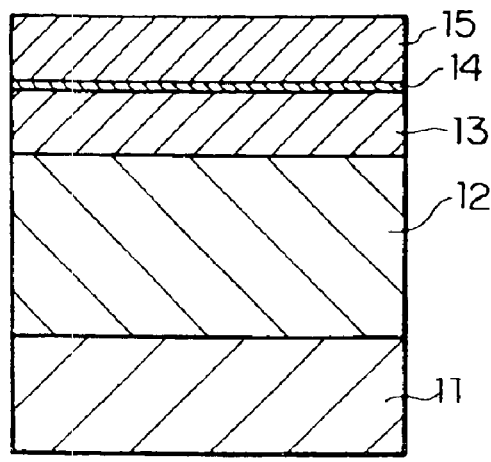
FIGS. 1A to 1E are sectional views of manufacturing steps showing an embodiment according to a manufacturing method for a semiconductor apparatus according to the present invention.

As shown in FIG. 1A, a film 12 to be processed made of, for example, silicon oxide film is formed on a substrate 11. Next, a first mask material film (mask material film) 13 made of an organic insulation film is formed on the film 12 to be processed. A dielectric film having low dielectric constant is used as this organic insulation film. The material referred to as the low dielectric film is the material having a lower dielectric constant than that of $SiO_2$, and is originally developed in order to reduce an inter-wiring capacitance of an LSI. For example, FLARE made by Honeywell Co., Ltd., SILK made by Dow Chemical Ltd. and the like are known as such material. Those organic system materials have a high heatproof temperature of 350° C. Thus, they can be positively used even as a hard mask material in a process for manufacturing a semiconductor. Hence, they can be used to form a micro hole pattern.

Moreover, a second mask material film 14, which serves as an etching mask to this first mask material film 13 and is made of, for example, an oxide film, is formed on the first mask material film 13. Moreover, a resist film 15 is formed on the second mask material film 14. The mask material film 14 is made of, for example, a silicon oxide film. With regard to this silicon oxide film, if it is the silicon oxide film serving as the etching mask to the first mask material film 13, a silicon oxide film formed by a chemical vapor deposition, a silicon oxide film of a coating type such as SOG film and the like can be used, and accordingly the film forming method is not specified. As mentioned above, the low dielectric film has the high heatproof property although it is the organic film. Thus, it can be sufficiently endured in the process for forming the mask material film 14 made of the oxide film by using the chemical vapor deposition.

Figure 1D:
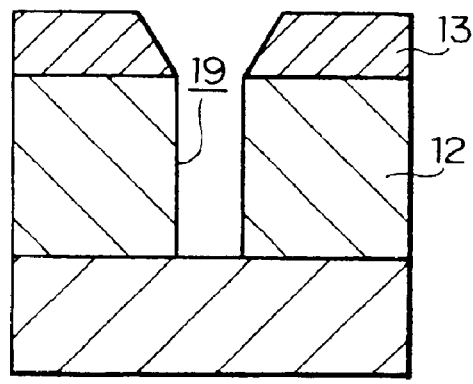
Figure 1B:
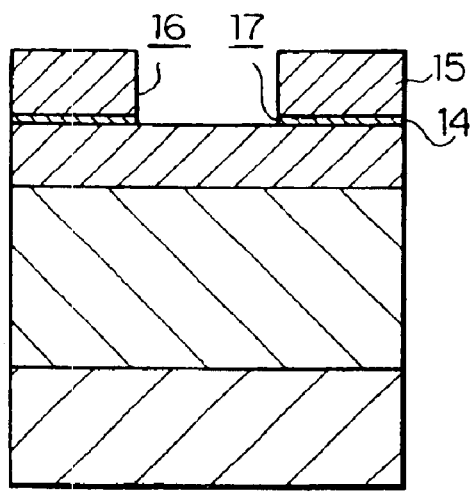

Then, as shown in FIG. 1B, the usual lithography process is carried out under this condition, and an aperture pattern 16 is formed on the resist film 15. As mentioned above, the formable pattern size at this time is limited by the limit resolution of the lithography technique. If the defect of the lithography process causes a line width and a positional deviation to depart from a range of a specification, it is possible to apply a reproducing process through a usual resist ashing. Even if a resist reproducing process is carried out, the second mask material film 14 is formed on the low dielectric film. Thus, the low dielectric film is protected by this second mask material film 14. Hence, the low dielectric film is never ashed in carrying out the reproducing process.

When the lithography process is completed without any trouble, the resist film 15 on which the aperture pattern 16 is formed is used as the mask, and the second mask material film 14 is etched to thereby form an aperture pattern 17.

Figure 1E:
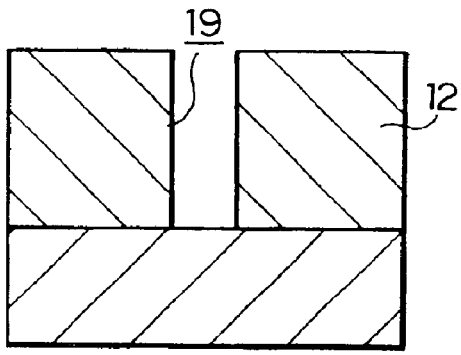
Figure 1C:
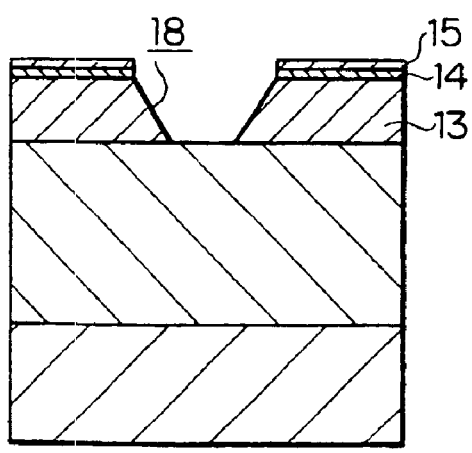

Next, as shown in FIG. 1C, the resist film 15 is used as the etching mask, and the first mask material film 13 made of the low dielectric film is etched. This etching is done such that in an open pattern 18 formed on the first mask material film 13, a bottom side is narrower than an aperture side, and its side-wall becomes taper-shaped. Actually, the taper etching can be carried out by setting a temperature of the substrate to a low temperature (for example, −50° C. to 0° C.).

Usually, the deposition reaction and the etching reaction are mixed in an etching chamber. The deposition reaction is easily carried out by lowering the temperature of the substrate. Thus, it is possible to process the taper shape. Ammonia ($NH_3$), mixed gas of hydrogen ($H_x$) and nitrogen ($N_2$), oxygen ($O_2$) and the like are used as the etching gas for the low dielectric film. In addition, a method of etching the organic insulation film to the taper shape in an excellently controlling manner is disclosed in Japanese Patent Publication No.H7-27886. According to this method, an aperture having a desirable taper angle can be formed, for example, by changing a content of phloro-carbon gas in the etching gas.

In the above-mentioned etching process, when the first mask material film 13 is etched, the resist film 15 is also etched and removed. Then, when the resist film 15 is perfectly removed, the second mask material film 14 serves as the etching mask, and the etching is further advanced.

Next, as shown in FIG. 1D, the first mask material film 13 is used as the etching mask, and the usual etching for the vertical processing is carried out. Consequently, an aperture pattern 19, which is further miniaturized over the size formed by the lithography process, is formed on the film 12 to be processed. In the etching at this time, the second mask material film 14 [refer to FIG. 1C] formed on the upper layer is desired to be formed in advance at a film thickness to be etched simultaneously with the film 12 to be processed.

After that, as shown in FIG. 1E, the first mask material film 13 made of the low dielectric film that is already unnecessary [refer to FIG. 1D] is removed by carrying out the ashing process similar to the resist removal. As a result, the aperture pattern 19 less than the resolution limit of the lithography technique can be formed on the film 12 to be processed.

Figure 2:
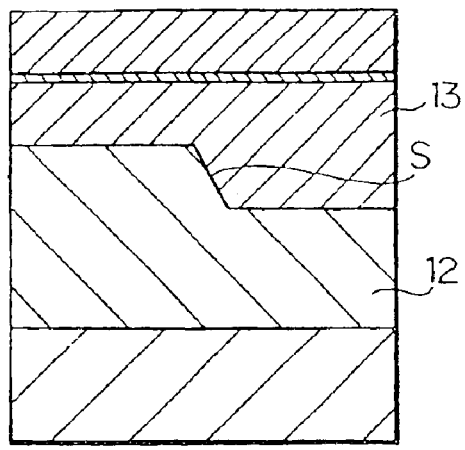
FIG. 2 is a sectional view of a schematic configuration for describing a case in which a film to be processed has a step.
Figure 3:
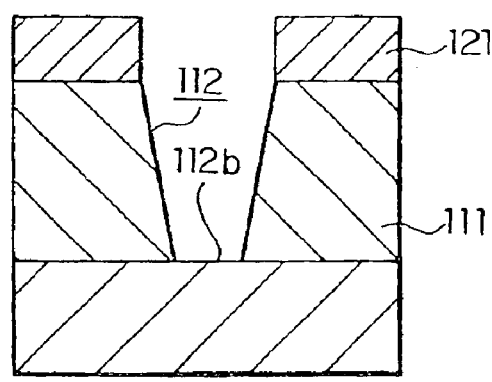
FIG. 3 is a sectional view of a schematic configuration for describing a conventional technique.
Figure 4:
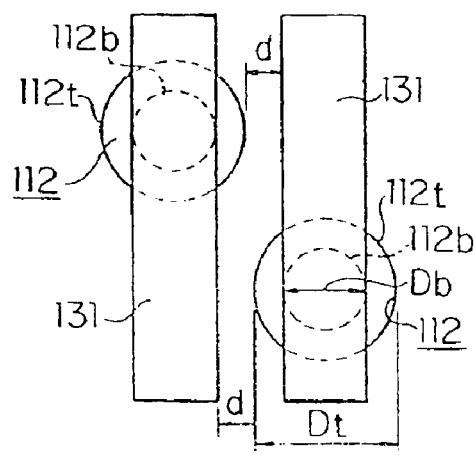
FIG. 4 is a sectional view of a schematic configuration for describing a problem.

As compared with the method of reducing the hole diameter (or the slit width) at the bottom by performing the taper etching on the film itself to be processed that is typically used, the method of the present invention can carry out the vertical processing of the film 12 to be processed. Thus, for example, when the aperture pattern 19 is the hole pattern, its control of the hole diameter thereof becomes easy. The problem of the lack of the matching margin as described in the problem is never induced. Also, as shown in FIG. 2, when the film 12 to be processed has a step S, the first mask material film 13 can function as a flattened layer. Thus, this method has the merit that the lithography step is advantageous.

When the above-mentioned manufacturing method is used to form the contact hole pattern, as the example, the lithography process is carried out to thereby form the aperture pattern 16 composed of the contact hole pattern having the diameter of 0.22 $\mu$m on the resist film 15. Then, for the first mask material film 13 made of the low dielectric film, the taper etching is used to finally obtain the aperture pattern 18 having the bottom diameter of 0.15 $\mu$m. When this first mask material film 13 is used as the etching mask and the film 12 to be processed is vertically etched, the aperture pattern 19 having a diameter of 0.15 $\mu$m is obtained.

A KrF excimer laser exposing apparatus (an exposure wave length=248 nm) in which NA=0.68 and σ=0.75 is used as the optical condition to expose the resist film 15. As the resist film, for example, R11JE made by JSR Corporation is used, and its film thickness is defined as 0.4 $\mu$m. Also, a parallel flat plate type of a plasma etching apparatus is used to etch the film 12 to be processed, and ammonium ($NH_3$) is used for the etching gas, and the temperature of the substrate is set to 0° C.

As mentioned above, the case in which the optical lithography is carried out to thereby form the micro contact hole pattern is exemplified. However, the present invention can be also applied to an electron beam lithography, an ion beam lithography and an X-ray lithography. Moreover, it can be applied not only to the contact hole but also the formation of the micro slit pattern.

What is claimed is:

1. A method of manufacturing a semiconductor apparatus comprising:

forming a first mask material film made of organic insulation film on a film to be processed;

forming a tapered aperture pattern, in which a bottom of said aperture pattern is made narrower than an open side of said aperture pattern, on said first mask material film; and forming a vertical aperture pattern in said film to be processed by etching said film to be processed using said first mask material film as a mask;

wherein the bottom of the tapered aperture pattern is formed at a desirable micro dimension exceeding capabilities of lithography techniques; and wherein said forming of the tapered aperture pattern includes cooling the substrate to between about minus 50 degrees Centigrade and about 0 degrees Centigrade.

2. The method of manufacturing a semiconductor apparatus according to claim 1 further including removing said first mask material film.

3. The method of manufacturing a semiconductor apparatus according to claim 1 wherein said film to be processed has a step.

4. The method of manufacturing a semiconductor apparatus according to claim 3 wherein forming the first mask material film on the film to be processed planarizes an unevenness created by said step.

5. The method of manufacturing a semiconductor apparatus according to claim 1 wherein said first mask material film is made of material having a low dielectric constant.

6. The method of manufacturing a semiconductor apparatus according to claim 1 wherein said first mask material film has a dielectric constant lower than silicon dioxide.

7. The method of manufacturing a semiconductor apparatus according to claim 1 further comprising forming a second mask material film on the first mask material film.

8. The method of manufacturing a semiconductor apparatus according to claim 7 further comprising forming a resist film on the second mask material film.

9. The method of manufacturing a semiconductor apparatus according to claim 8 further comprising etching the resist film.

10. The method of manufacturing a semiconductor apparatus according to claim 9 further comprising etching the second mask material film.

11. The method of manufacturing a semiconductor apparatus according to claim 1 wherein the first mask material film has a heatproof temperature of about 350 degrees Centigrade.

12. A method of manufacturing a semiconductor apparatus comprising:

forming a first mask material film made of organic insulation film on a film to be processed;

forming a tapered aperture pattern, in which a bottom of said aperture pattern is made narrower than an open side of said aperture pattern, on said first mask material film; and forming a vertical aperture pattern in said film to be processed by etching said film to be processed using said first mask material film as a mask;

wherein the bottom of the tapered aperture pattern is formed at a desirable micro dimension exceeding capabilities of lithography techniques; and wherein the first mask material film has a heatproof temperature of about 350 degrees Centigrade.

13. The method of manufacturing a semiconductor apparatus according to claim 12 further including removing said first mask material film.

14. The method of manufacturing a semiconductor apparatus according to claim 12 wherein said first mask material film is made of material having a low dielectric constant.

15. The method of manufacturing a semiconductor apparatus according to claim 12 wherein said first mask material film has a dielectric constant lower than silicon dioxide.

16. The method of manufacturing a semiconductor apparatus according to claim 12 wherein said film to be processed has a step.

17. The method of manufacturing a semiconductor apparatus according to claim 16 wherein forming the first mask material film on the film to be processed planarizes an unevenness created by said step.

18. The method of manufacturing a semiconductor apparatus according to claim 12 further comprising forming a second mask material film on the first mask material film.

19. The method of manufacturing a semiconductor apparatus according to claim 18 further comprising forming a resist film on the second mask material film.

20. The method of manufacturing a semiconductor apparatus according to claim 19 further comprising etching the resist film.

21. The method of manufacturing a semiconductor apparatus according to claim 20 further comprising etching the second mask material film.

22. A method of manufacturing a semiconductor apparatus comprising:

forming a film to be processed having a top surface on a substrate;

forming a first mask material film made of organic insulation film on the film to be processed;

forming a tapered aperture pattern, in which a bottom of said aperture pattern is made narrower than an open side of said aperture pattern, on said first mask material film; and forming a vertical aperture pattern in said film to be processed by etching said film to be processed using said first mask material film as a mask;

wherein the bottom of the tapered aperture pattern is formed at a desirable micro dimension exceeding capabilities of lithography techniques;

wherein forming the film to be processed on the substrate includes forming at least three successive portions of the film to be processed directly on the substrate, the portions including a first portion having a first thickness, a second portion having a second thickness, which varies between the first thickness and a third thickness to form a step on said top surface, and a third portion having the third thickness; and wherein forming the first mask material film on the film to be processed planarizes an unevenness created by said step.

* * * * *